(12) United States Patent
Isagawa et al.

(10) Patent No.: US 12,020,888 B2
(45) Date of Patent: Jun. 25, 2024

(54) ELECTRONIC APPARATUS, NON-CONTACT SWITCH, AND PHOTOELECTRIC SENSOR

(71) Applicant: OMRON Corporation, Kyoto (JP)

(72) Inventors: Yuki Isagawa, Kyoto (JP); Kazuyoshi Nishikawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 311 days.

(21) Appl. No.: 17/634,242

(22) PCT Filed: Mar. 3, 2020

(86) PCT No.: PCT/JP2020/008949
§ 371 (c)(1),
(2) Date: Feb. 10, 2022

(87) PCT Pub. No.: WO2021/049066
PCT Pub. Date: Mar. 18, 2021

(65) Prior Publication Data
US 2022/0336164 A1    Oct. 20, 2022

(30) Foreign Application Priority Data

Sep. 12, 2019  (JP) .................................. 2019-166209

(51) Int. Cl.
*H01H 9/04*    (2006.01)
*H01H 36/00*   (2006.01)

(52) U.S. Cl.
CPC .............. *H01H 9/04* (2013.01); *H01H 36/00* (2013.01)

(58) Field of Classification Search
CPC .......... H01H 9/00; H01H 9/02; H01H 9/0214; H01H 9/04; H01H 36/00; H01H 36/0006; H01H 36/0013; H01H 36/0033; H01H 50/00; H01H 50/023; H01H 2050/02; H01H 2050/023; H05K 5/06
USPC ...................................................... 200/302.1
See application file for complete search history.

(56) References Cited

U.S. PATENT DOCUMENTS

2010/0227495 A1    9/2010    Matsumura et al.

FOREIGN PATENT DOCUMENTS

| CN | 102626975 | 8/2012 |
|---|---|---|
| EP | 2884826 | 6/2015 |
| EP | 3139715 | 3/2017 |
| JP | H0521492 | 1/1993 |
| JP | H09213436 | 8/1997 |
| JP | H10286889 | 10/1998 |

(Continued)

OTHER PUBLICATIONS

"Search Report of Europe Counterpart Application", issued on Sep. 5, 2023, pp. 1-8.

(Continued)

*Primary Examiner* — Anthony R Jimenez
(74) *Attorney, Agent, or Firm* — JCIPRNET (57) ABSTRACT

An electronic apparatus includes, in a case, substrates with electronic components mounted thereon, a thermoplastic hot-melt resin, and a fluid branch member, wherein: the inside of the case is divided into a plurality of spaces; the plurality of spaces are at least any space among spaces between the case and the substrates and spaces between the substrates, and are filled with the thermoplastic hot-melt resin; and the fluid branch member is provided with an opening as an inlet for the thermoplastic hot-melt resin, and flow path parts for branching the thermoplastic hot-melt resin into multiple parts and guiding the same.

6 Claims, 4 Drawing Sheets

(56) References Cited

FOREIGN PATENT DOCUMENTS

| | | |
|---|---|---|
| JP | 2002311307 | 10/2002 |
| JP | 2003332799 | 11/2003 |
| JP | 2004186563 | 7/2004 |
| JP | 2009026973 | 2/2009 |
| JP | 2010092973 | 4/2010 |
| JP | 2014075463 | 4/2014 |
| JP | 2014096437 | 5/2014 |
| JP | 2019212493 | 12/2019 |
| WO | 2014132973 | 9/2014 |

OTHER PUBLICATIONS

"International Search Report (Form PCT/ISA/210) of PCT/JP2020/008949," mailed on Jun. 2, 2020, with English translation thereof, pp. 1-4.

"Written Opinion of the International Searching Authority (Form PCT/ISA/237) of PCT/JP2020/008949," mailed on Jun. 2, 2020, with English translation thereof, pp. 1-8.

Office Action of China Counterpart Application, with English translation thereof, issued on Feb. 11, 2023, pp. 1-12.

ELECTRONIC APPARATUS, NON-CONTACT SWITCH, AND PHOTOELECTRIC SENSOR

CROSS-REFERENCE TO RELATED APPLICATION

This application is a 371 application of the International PCT application serial no. PCT/JP2020/008949, filed on Mar. 3, 2020, which claims the priority benefit of Japan Patent Application No. 2019-166209, filed on Sep. 12, 2019. The entirety of each of the above-mentioned patent applications is hereby incorporated by reference herein and made a part of this specification.

TECHNICAL FIELD

The disclosure relates to an electronic apparatus and the like in which a substrate having electronic components mounted thereon is provided in a case and the case is filled with a resin.

BACKGROUND ART

Conventionally, in an electronic apparatus in which a substrate having electronic components mounted thereon is provided in a case, a space between the substrate and the inside of the case is filled with a hot-melt resin for the purpose of protecting the substrate.

Patent Literature 1 discloses a case for protecting electronic components by eliminating poor filling of a hot-melt resin even when there is a thick part in a cavity filled with the hot-melt resin. Specifically, the case has a structure including a first part which is thin in the cavity filled with the hot-melt resin, a second part which is thicker than the first part in the cavity, and a wall part which sets a flow end part of the hot-melt resin in the first part of the cavity.

CITATION LIST

Patent Literature

Patent Literature 1: Japanese Patent Laid-Open No. 2014-075463

SUMMARY OF INVENTION

Technical Problem

However, in the case, the wall part provided on the substrate cannot always function as a wall because a gap is generated between the wall part and the case due to variations in the assembly of the substrate and the bending of the substrate caused by the flow stress of the hot-melt resin or the like. Further, the wall part may not be provided at a desired position due to the arrangement restrictions of the substrate mounting components.

Further, when a plurality of substrates is used, the flow of the hot-melt resin becomes complicated and a plurality of wall parts is provided in order to control the flow end part of the hot-melt resin, which causes excessive restrictions on the substrate design.

Here, the disclosure has been made in view of the above-described problems and an objective thereof is to provide an electronic apparatus having excellent voltage resistance and water resistance.

Solution to Problem

The disclosure employs the following configuration in order to solve the above-described problems.

That is, an electronic apparatus according to an aspect of the disclosure (hereinafter, referred to as "this embodiment") includes: a case; one or more substrates disposed in the case, on which an electronic component is mounted; a thermoplastic hot-melt resin filled in the case; and a fluid branch member, wherein the inside of the case is divided into a plurality of spaces, wherein the plurality of spaces are at least any space among spaces between the case and the substrate and spaces between the substrates and are filled with the thermoplastic hot-melt resin, and wherein the fluid branch member is provided with an opening as an inlet for filling the thermoplastic hot-melt resin into the case and a flow path part for branching the thermoplastic hot-melt resin into multiple parts and guiding the thermoplastic hot-melt resin from the opening to the plurality of spaces. Additionally, the "resin" includes not only resin compounds but also mixtures containing fillers such as silica, stabilizers such as antioxidants, and additives such as plasticizers.

Further, a non-contact switch according to this embodiment includes two electronic apparatuses, the first electronic apparatus includes an actuator as the electronic component, the second electronic apparatus includes a sensor as the electronic component, and when a distance between the actuator and the sensor becomes a predetermined value or less, the output of the sensor is turned on.

Further, a photoelectric sensor according to this embodiment is a photoelectric sensor configured by the electronic apparatus and includes at least one of a light transmitting part and a light receiving part as the electronic component.

Effects of Invention

According to an aspect of the disclosure, it is possible to provide an electronic apparatus having excellent voltage resistance and water resistance.

DESCRIPTION OF EMBODIMENTS

Hereinafter, an embodiment according to an aspect of the disclosure (hereinafter, also referred to as an "embodiment") will be described with reference to the drawings.

δ1. Application Example

Figure 1:
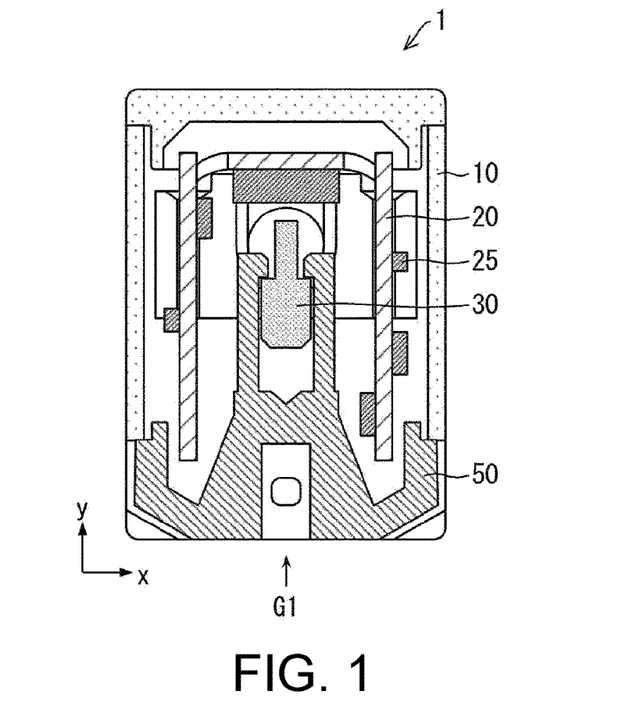
FIG. 1 is a diagram schematically showing a cross-section of an electronic apparatus according to this embodiment taken along the line A-A in FIG. 3.
Figure 2:
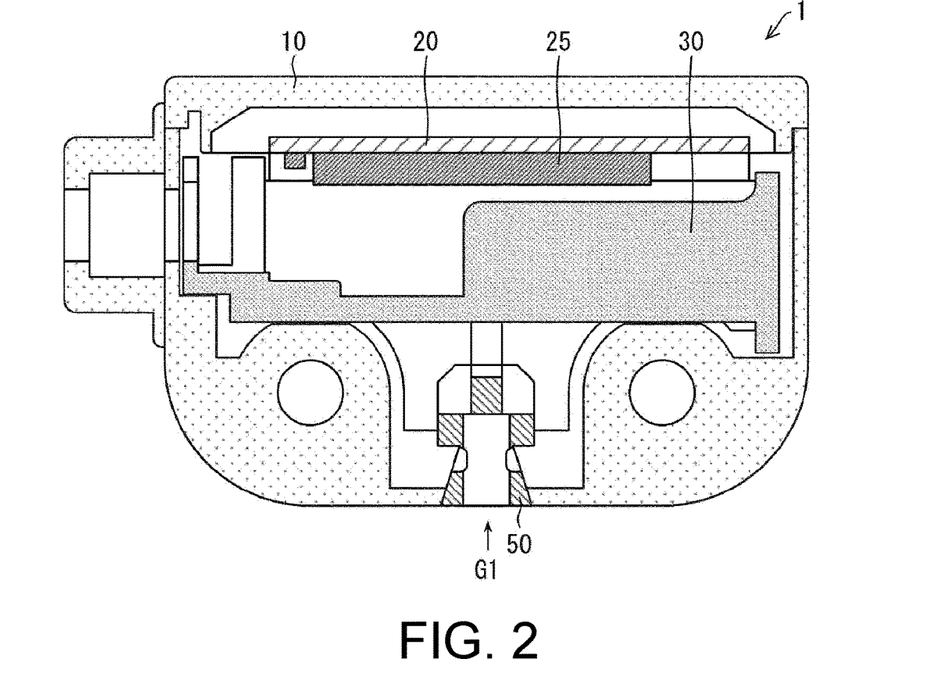
FIG. 2 is a diagram schematically showing a cross-section of the electronic apparatus according to this embodiment taken along the line B-B in FIG. 3.
Figure 3:
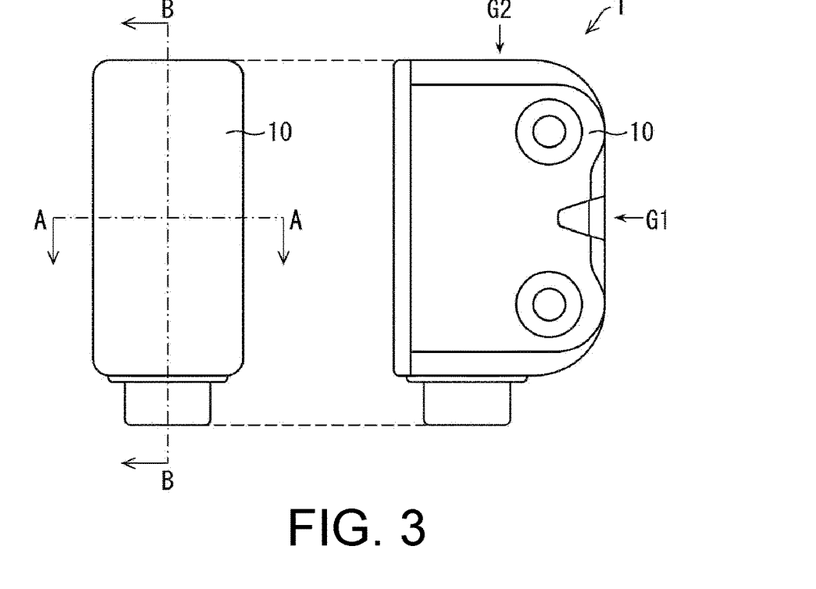
FIG. 3 is a diagram showing an example of an appearance of the electronic apparatus according to this embodiment.

An example of a situation in which the disclosure is applied will be described with reference to FIGS. 1 to 3. FIG. 1 is a diagram schematically showing a cross-section of an electronic apparatus according to this embodiment taken along the line A-A in FIG. 3. FIG. 2 is a diagram schematically showing a cross-section of the electronic apparatus according to this embodiment taken along the line B-B in FIG. 3. FIG. 3 is a diagram showing an example of an appearance of the electronic apparatus according to this embodiment.

As shown in FIG. 1, an electronic apparatus 1 according to this embodiment includes a case 10, three substrates 20 which are disposed in the case 10 and on which an electronic component 25 is mounted, a fluid branch member 50, and a substrate holding part 30. Further, in the electronic apparatus 1 according to this embodiment, a space of the case 10 is filled with a thermoplastic hot-melt resin (not shown). The substrate 20 and the fluid branch member 50 of this embodiment are fixed to the substrate holding part 30. In FIG. 2, the case 10, the substrate 20 on which the electronic component 25 is mounted, the fluid branch member 50 for filling the case 10 with the thermoplastic hot-melt resin, and the substrate holding part 30 are shown as the inside of the electronic apparatus 1 according to this embodiment. The electronic apparatus 1 according to this embodiment is filled with the thermoplastic hot-melt resin through the fluid branch member 50 in a direction indicated by an arrow G1 from the position indicated by an arrow G1 in FIG. 3.

As shown in FIG. 1, the inside of the case 10 of this embodiment is divided by the substrate 20 into a space between the case 10 and each substrate 20 and a space surrounded by three substrates 20. As will be described in detail later, the fluid branch member 50 of this embodiment is provided with branches which branch the thermoplastic hot-melt resin in the fluid branch member 50 so that the thermoplastic hot-melt resin can be independently filled into a plurality of divided spaces through different paths when manufacturing the electronic apparatus 1. In this way, the electronic apparatus 1 according to this embodiment can control the flow of the thermoplastic hot-melt resin when filling the case 10 with the resin.

In the electronic apparatus 1 according to this embodiment, since the thermoplastic hot-melt resin can be independently filled through different paths even when the plurality of spaces has different sizes, it is possible to suppress the generation of unfilled places that may occur especially in a small space. Accordingly, in the embodiment according to an aspect of the disclosure, it is possible to suppress the generation of places where the substrate 20 is not covered with the thermoplastic hot-melt resin and to provide the electronic apparatus 1 having excellent voltage resistance and water resistance.

δ2. Configuration Example

Hereinafter, an example of the configuration of the electronic apparatus 1 according to this embodiment will be described with reference to FIGS. 1 to 3. In the example of FIGS. 1 and 2, the electronic apparatus 1 includes the case 10, the substrate 20 on which the electronic component 25 is mounted, the thermoplastic hot-melt resin, the fluid branch member 50, and the substrate holding part 30. Hereinafter, the "thermoplastic hot-melt resin" is simply abbreviated as the "resin".

<Member Constituting Electronic Apparatus>
(Case)

The case 10 of this embodiment stores the substrate 20, the resin, the fluid branch member 50, and the substrate holding part 30 therein. In an example, the case 10 may store cable components and the like connected to the substrate 20 in addition to the above.

The case 10 of this embodiment is opened at a position indicated by G1 in order to fill the resin in a direction indicated by the arrow G1 from the position indicated by the arrow G1 in FIG. 1 when manufacturing the electronic apparatus 1 (filling port). Further, the case 10 may have an air release hole (air vent) opened at a position where the flowing resin finally reaches in each space so that the resin flowing when filling the resin from the filling port can push out the air in the case 10.

Further, the case 10 is sealed when an open place such as a filling port is sealed so that the electronic apparatus 1 has excellent water resistance. The size and shape of the case 10 may be appropriately designed in accordance with the usage method of the electronic apparatus 1. The case 10 may be made of, for example, an acrylonitrile/butadiene/styrene copolymer (ABS) resin, a polybutylene terephthalate (PBT) resin, a polyphenylene sulfide (PPS) resin, or a polyamide (PA) resin.

(Substrate)

The substrate 20 of this embodiment is disposed in the case 10 and the electronic component 25 is mounted thereon. Examples of the electronic component 25 that can be mounted on the substrate 20 include an antenna component, a light emitting element, a light receiving element, various sensor components, a control IC, an amplifier circuit, and a power supply circuit. The substrate 20 of this embodiment is composed of a glass epoxy substrate (FR-4), a glass composite substrate (CEM-3), a paper phenol substrate (FR-1, 2), and the like.

(Fluid Branch Member)

Figure 4:
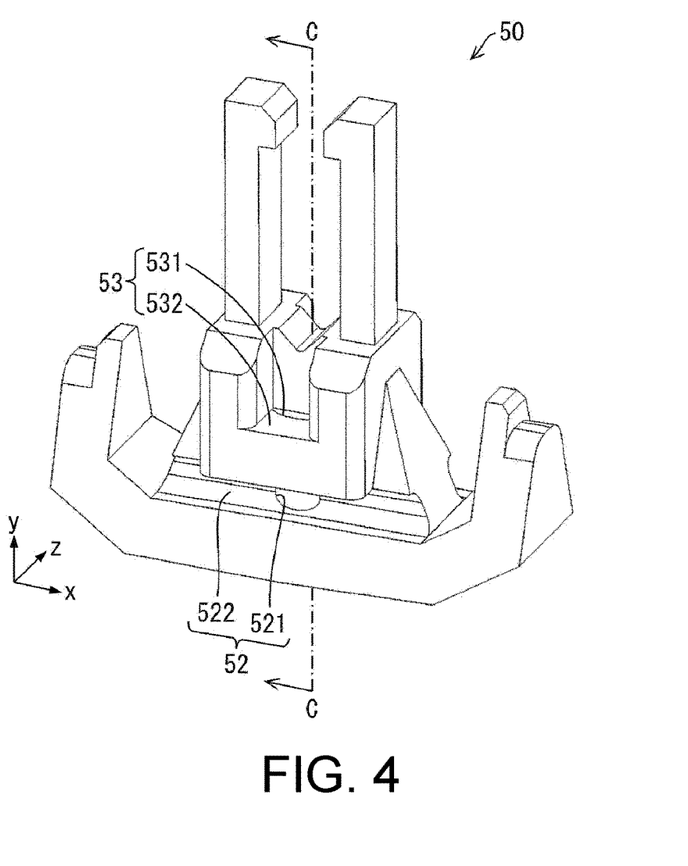
FIG. 4 is a perspective view showing an example of a fluid branch member according to this embodiment.
Figure 5:
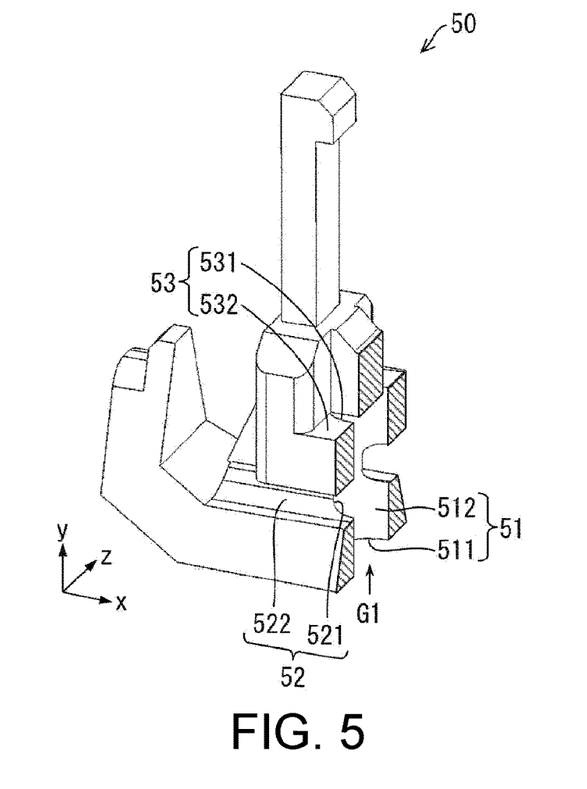
FIG. 5 is a perspective view showing a cross-section of the fluid branch member according to this embodiment taken along the line C-C in FIG. 4.

The fluid branch member 50 of this embodiment is a member having a branched pipe for distributing the resin flowing into the case 10 to a plurality of spaces in the case 10. The fluid branch member 50 of this embodiment will be described with reference to FIGS. 4 and 5. FIG. 4 is a perspective view showing an example of the fluid branch member according to this embodiment. FIG. 5 is a perspective view showing a cross-section of the fluid branch member according to this embodiment taken along the line C-C in FIG. 4.

As shown in FIGS. 4 and 5, the fluid branch member 50 of this embodiment includes a filling part 51 which includes an opening 511 and a branch pipe 512, a first flow path part 52 which includes a first outflow part 521 and a first groove 522, and a second flow path part 53 which includes a second outflow part 531 and a second groove 532.

The opening 511 of this embodiment is an inlet for allowing the resin to flow into the fluid branch member 50 (a direction indicated by the arrow G1) from the outside in the process of manufacturing the electronic apparatus 1. In an example, the opening 511 is located at a center part of a surface opened in the fluid branch member 50. The branch pipe 512 is a cylindrical pipe that follows the opening 511 and extends from the opening 511 in the y-axis direction in FIG. 5.

The branch pipe 512 has a pair of openings as the first outflow part 521 on the facing side surfaces in the z axis in FIG. 5. Further, the second outflow part 531 is opened at an end part on the side opposite to the opening 511 in the branch pipe 512. The second outflow part 531 is a pair of openings divided into two parts with the x-axis direction in FIG. 4 as a boundary.

The first groove 522 is a pair of grooves provided on each surface extending horizontally with an opening surface from the first outflow part 521 on the outside of the branch pipe 512. The first groove 522 extends from the first outflow part 521 to both sides of the first outflow part 521 along the axis orthogonal to the longitudinal direction of the branch pipe 512, that is, the x axis in FIGS. 4 and 5. The second groove 532 is a pair of grooves extending in a direction perpendicular to the opening surface from each of the second outflow parts 531 and extends from the second outflow part 531 in the longitudinal direction of the branch pipe 512, that is, the y-axis direction in FIGS. 4 and 5.

All of the filling part 51, the first outflow part 521, the first groove 522, the second outflow part 531, and the second groove 532 have a cross-sectional area of 0.2 mm² or more. In the electronic apparatus 1 according to this embodiment, it is possible to optimize the fluidity (flow amount) of the resin into the plurality of spaces in the case 10 by adjusting the size of the cross-sectional area of the filling part 51, the first outflow part 521, the first groove 522, the second outflow part 531, and the second groove 532. As a result, it is possible to suppress the generation of the unfilled place of the resin in the case 10. Additionally, the cross-sectional area of the branch pipe 512 may not be constant in the entire pipe. The same applies to the first groove 522 and the second groove 532.

(Substrate Holding Part)

The electronic apparatus 1 according to this embodiment includes the substrate holding part 30. The substrate holding part 30 can fix the substrate 20 to a predetermined position in the case 10. The size and shape of the substrate holding part 30 may be appropriately designed in accordance with the application method of the electronic apparatus 1. Further, the substrate holding part 30 can also fix the fluid branch member 50. In this case, the fluid branch member 50 may have a convex portion, a concave portion, and the like that can be combined.

The substrate holding part 30 may be made of, for example, an acrylonitrile/butadiene/styrene copolymer (ABS) resin, a polybutylene terephthalate (PBT) resin, a polyphenylene sulfide (PPS) resin, or a polyamide (PA) resin.

(Resin)

As the resin (thermoplastic hot-melt resin) filled into the electronic apparatus 1 according to this embodiment, for example, any one of a polyamide-based resin, a polyester-based resin, and a polyolefin-based resin, or a combination thereof can be used. In an example, when a resin that can be molded at a low temperature (for example, 160° C. or more and 220° or less) and a low pressure (10 MPa or less) is used, it is possible to reduce heat damage and stress damage that may be given to various members such as the electronic component 25 and the cable component built in the case 10 when manufacturing the electronic apparatus 1. Further, in this embodiment, from the viewpoint of further improving the fluidity of the resin and from the viewpoint of suppressing the generation of unfilled places of the resin even in a small space (for example, the shortest distance in the space is less than 1.0 mm) in the case 10, for example, the melt viscosity of the resin can be 500 dPa·s or less. From the viewpoint of improving the sealing performance of the electronic apparatus 1 (for example, oil resistance against cutting oil, water resistance satisfying standards such as IP67 and IP69K, and chemical resistance required for ECO-LAB certification at the time of commercialization), a polyamide-based resin or a polyester-based resin is preferably used, and among them, a polyester-based resin having crystallinity is preferable.

Additionally, the "polyamide-based resin" is a resin containing a constituent unit derived from polyamide as a main constituent element and includes a homopolymer of polyamide and both a monomer copolymerizable with polyamide and a copolymer of polyamide. The same applies to other resins listed as "based resins". Further, the "resin" includes not only a resin compound but also a mixture containing a filler such as silica, a stabilizer such as an antioxidant, and an additive such as a plasticizer.

<Arrangement of Members>

In the electronic apparatus 1 according to this embodiment, the above-described members are stored in the case 10. Hereinafter, an example of the arrangement of the members in the case 10 will be described with reference to FIGS. 1 and 2.

(Substrate)

In FIG. 1, three substrates 20 are provided in the case 10 (which may correspond to the "first substrate" or the "second substrate" in the claims) and are disposed as below. That is, one substrate is disposed in the vicinity of one surface along the x-axis direction of the case 10 shown in FIG. 1 in parallel to the surface and one substrate is disposed in the vicinity of each of two facing surfaces along the y-axis direction of the case 10 in parallel to the surface. Additionally, in this embodiment, three substrates 20 are disposed, but the number of the substrates 20 of the electronic apparatus 1 according to the disclosure may be one or more.

In this embodiment, the substrate 20 of this embodiment is fixed to a predetermined position in the case 10 by the substrate holding part 30. Further, the substrate 20 may be further fixed to the case 10. When the substrate 20 is firmly fixed, it is possible to prevent misalignment even when the flow stress of the resin to be filled is large.

The substrate 20 divides the space of the case 10. In an example, the divided spaces may be the space between the case 10 and the substrate 20 (which may correspond to at least one of the "first space" and the "second space" in the claims) or the space between the substrates 20 (which may correspond to the "third space" in the claims). The space of the case 10 of this embodiment includes the space between three substrates 20 and three sides of the case 10 in the vicinity of the substrate 20 and the space surrounded by three substrates 20.

In this embodiment, the distance between the case 10 and the substrate 20 and the distance between the substrates 20 are not particularly limited and are 0.3 mm to 1.5 mm as an example.

(Fluid Branch Member)

The fluid branch member 50 of this embodiment includes the opening 511 along the surface having the filling port so that the resin is filled from the filling port of the case 10 toward the inside of the case 10 (that is, in a direction indicated by the arrow G1 from the position indicated by the arrow G1) when manufacturing the electronic apparatus 1 and the flow path parts 52 and 53 are stored in the case 10.

In this embodiment, the flow path parts 52 and 53 of the fluid branch member 50 continue to the plurality of spaces divided by the substrate 20. More specifically, the first flow path part 52 continues to the space between three substrates 20 and three sides of the case 10 in the vicinity of the substrate 20. Further, the second flow path part 53 continues to the space surrounded by three substrates 20.

In this embodiment, the fluid branch member 50 is fixed to the substrate holding part 30. As a fixing method, for example, a method of combining the convex portion and the concave portion respectively provided in the fluid branch member 50 and the substrate holding part 30 may be exemplified, but the disclosure is not limited thereto.

(Substrate Holding Part)

The substrate holding part 30 of this embodiment is located in the space surrounded by three substrates 20. The distance between the substrate 20 and the substrate holding part 30 is not particularly limited, but is 0.3 mm to 1.5 mm as an example.

The substrate holding part 30 of this embodiment fixes the substrate 20 to a predetermined position in the case 10 as an example. Further, the fluid branch member 50 can be fixed. In this case, it is preferable not to disturb the flow of the resin flowing out of the fluid branch member 50.

(Resin)

The resin (thermoplastic hot-melt resin) is filled into each of the spaces divided by the substrate 20 in the case 10 and covers the substrate 20. The covering thickness of the resin is not particularly limited from the viewpoint of sealing performance, but is preferably 0.3 mm or more from the viewpoint of the voltage resistance of the electronic apparatus 1. In an example, if the covering thickness of the resin is 0.3 mm or more, a sufficient insulation protection function can be ensured.

Further, the resin covers the substrate 20 and is filled into the space of the case 10 without gaps. In this embodiment, since the distance between the case 10 and the substrate 20 and the distance between the substrates 20 are, for example, about 0.3 mm to 1.5 mm, it is preferable that the covering thickness of the resin is 0.3 mm or more from the viewpoint of ensuring the fluidity of the resin and suppressing the generation of the unfilled place of the resin.

§3. Sealing of Case by Resin

An example of a process of sealing the case 10 by filling the resin into the case 10 when manufacturing the electronic apparatus 1 is as below. First, the fluid branch member 50 is disposed in the case 10 together with the substrate 20 and the substrate holding part 30 connected to cable components and the like as described above. The case 10 storing each member is installed in a mold for resin molding and the resin is filled into the mold through the fluid branch member 50. Resin molding and filling can be performed according to a conventional method using an injection molding machine, a gear pump type applicator, or the like. That is, various conditions at the time of molding and filling the resin may be appropriately adjusted depending on the resin to be used and the electronic apparatus 1 to be manufactured. However, the components in the resin may separate when melted for a long time depending on the resin. In such a case, a molding machine that employs a sequential melting method may be used as the molding machine. The electronic apparatus 1 can be manufactured by filling the resin into the mold, cooling the resin in the mold, and then taking out the product.

Here, an example of the flow of the resin when filling the case 10 with the resin will be described with reference to FIGS. 1, 4, and 5. First, the resin flows in a direction indicated by the arrow G1 from the position (the filling port of the case 10) indicated by the arrow G1 in FIG. 1. The resin flowing from the filling port of the case 10 passes through the opening 511 of the fluid branch member 50 and enters the branch pipe 512 that follows the opening. The resin having entered the branch pipe 512 advances in the y-axis direction in FIG. 5. The first outflow part 521 (opening) is provided on the side surface of the branch pipe 512. Accordingly, when the resin reaches the first outflow part 521, a part of the resin flows out of the branch pipe 512 through the first outflow part 521 while further advancing in the branch pipe 512. Since the first outflow part 521 is a pair of openings, the resin branches into three parts here.

The resin flowing out of the first outflow part 521 flows into the first groove 522. Since the first groove 522 extends from the first outflow part 521 to both sides of the first outflow part 521 along the x axis in FIGS. 4 and 5, the resin flowing out of the first outflow part 521 is divided into two parts and flows through the first groove 522. On the other hand, when the resin further advanced in the branch pipe 512 reaches the second outflow part 531, the resin flows out of the branch pipe 512 through the second outflow part 531. Since the second outflow part 531 is a pair of openings, the resin branches into two parts here. Since the second outflow part 531 communicates with the second groove 532, the resin flowing out of the second outflow part 531 directly flows into the second groove 532. In this way, in the above-described example, the resin flowing from the filling port is branched into six parts in total by the fluid branch member 50.

The fluid branch member 50 of this embodiment can branch the resin into multiple parts and independently fill the resin into the space between the case 10 and each substrate 20 and the space surrounded by three substrates 20 through different paths. In this way, the electronic apparatus 1 according to this embodiment can control the flow of the resin when filling the resin into the case 10.

Since the resin has properties such as high viscosity, the resin is greatly affected by the flow resistance when the resin flows. Further, the flow resistance decreases as the space in which the resin flows increases. When the resin flows from one point into all of the plurality of spaces divided to have different sizes in the case, the resin is generally preferentially filled from the larger space (smaller flow resistance) among the plurality of spaces. When the filling of the resin into the space having a small flow resistance is completed and the resin is filled in the remaining space, air cannot easily escape in the space having a large flow resistance and hence the adiabatic compression resistance of the air may stop the flow of the resin. In this case, the unfilled place remains in the case. Since the substrate is not covered with the resin in the unfilled place, such an electronic apparatus has poor voltage resistance and water resistance.

Additionally, in the present specification, "preferential filling" means that the filling of the resin is first completed due to at least one of the case in which the filling of the resin is first started and the case in which the amount of the resin filled per unit hour is large.

In the electronic apparatus 1 according to this embodiment, when the size of the space between the case 10 and each substrate 20 and the size of the space surrounded by three substrates 20 are compared with each other, the former space is smaller than the latter space. However, since the electronic apparatus 1 according to this embodiment includes the fluid branch member 50, it is possible to independently fill the resin into these spaces through different paths. Therefore, it is possible to suppress the resin from being preferentially filled into the large space, that is, the space between the case 10 and each substrate 20. Accordingly, it is possible to suppress the unfilled place of the resin from being generated in the small space, that is, the space between the case 10 and each substrate 20. When the generation of the unfilled place of the resin is suppressed, it is possible to suppress the generation of the place in which the substrate 20 is not covered with the resin and to provide the electronic apparatus 1 having excellent voltage resistance and water resistance.

Further, in the electronic apparatus 1 according to this embodiment, since the resin filled into the case 10 is independently filled into the respective spaces through different paths, the air in the space can be gradually pushed out from the air vent arbitrarily provided in the case 10. Accordingly, since the air in the case 10 is efficiently discharged, it is possible to minimize the residual air bubbles in the case 10 and to provide the electronic apparatus 1 having excellent voltage resistance and water resistance.

In the electronic apparatus 1 according to this embodiment, the flow resistance of the resin when the resin is filled into the plurality of spaces depends on the size of the plurality of spaces filled with the resin and the size (the cross-sectional area and the length) of the flow path parts 52 and 53 of the fluid branch member 50 extending from the filling port to each space. Therefore, it is possible to suppress the generation of the unfilled place of the resin in the case 10 without increasing the size of each space larger than necessary by adjusting the size of the flow path parts 52 and 53. Thus, according to an aspect of the disclosure, it is possible to provide the electronic apparatus having excellent voltage resistance and water resistance and a small size.

§4. Application Example of Electronic Apparatus

Figure 7:
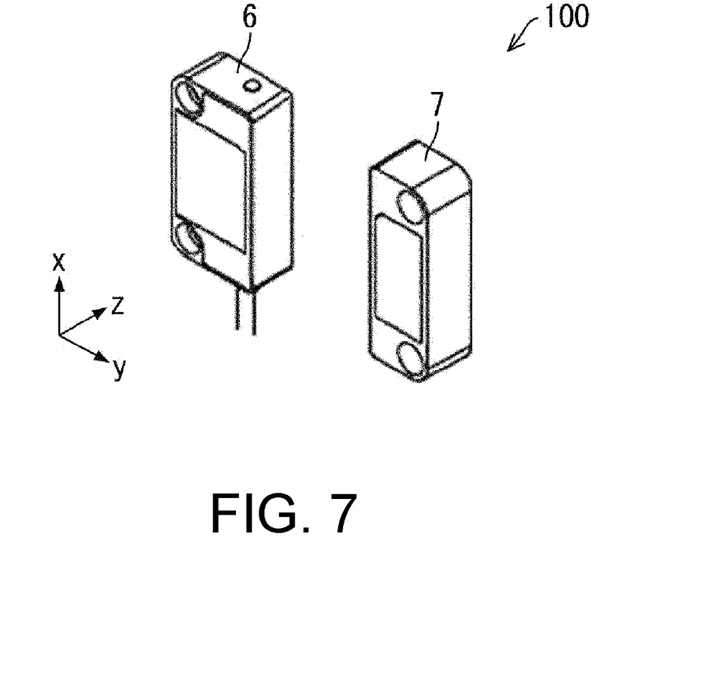
FIG. 7 is a diagram showing an example of a non-contact safety switch using the electronic apparatus according to this embodiment.
Figure 8:
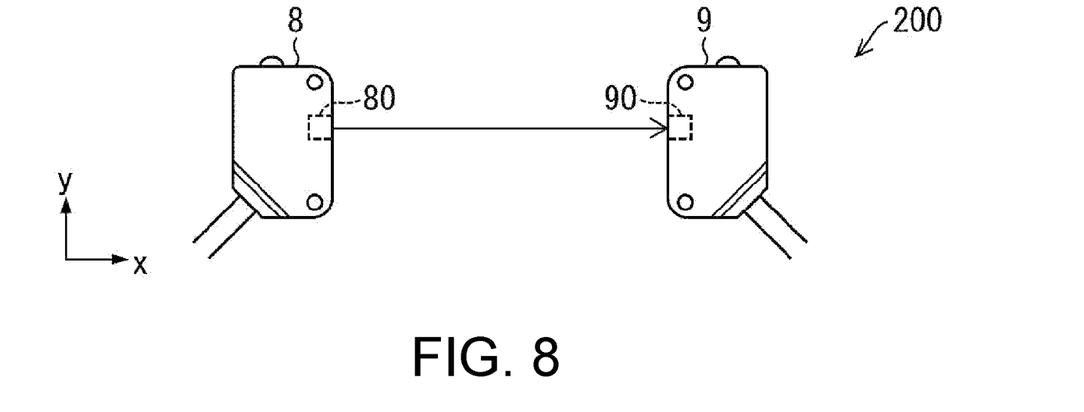
FIG. 8 is a diagram showing an example of a photoelectric sensor using the electronic apparatus according to this embodiment.

The electronic apparatus 1 according to this embodiment can be applied to, for example, a non-contact safety switch and a photoelectric sensor. Hereinafter, a description will be made with reference to FIGS. 7 and 8. FIG. 7 is a diagram showing an example of the non-contact safety switch using the electronic apparatus according to this embodiment. FIG. 8 is a diagram showing an example of the photoelectric sensor using the electronic apparatus according to this embodiment.

(Application Example to Non-Contact Safety Switch)

FIG. 7 is a diagram showing a configuration example when the electronic apparatus 1 is applied to a non-contact safety switch 100 (non-contact switch). The non-contact safety switch 100 is realized by the combination of the electronic apparatus 1 functioning as an actuator 6 and the electronic apparatus 1 functioning as a sensor body 7. When the distance between the actuator 6 and the sensor body 7 becomes a predetermined value or less, the output of the sensor body 7 is turned on. Meanwhile, when the distance between the actuator 6 and the sensor body 7 becomes larger than the predetermined value, the output of the sensor body 7 is turned off. Examples of the non-contact safety switch 100 include a reed switch type and an RFID type.

The reed switch type has a structure in which a magnet functioning as an electronic component is built in the actuator 6 and a plurality of reed switches functioning as electronic components are built in the sensor body 7. When the distance between the actuator 6 and the sensor body 7 becomes short, the magnetic field in the sensor body 7 becomes stronger, so that the contact of the reed switch is operated and the output from the sensor body 7 is turned on.

The RFID type has a structure in which RFID functioning as an electronic component is built in the actuator 6 and an RFID reader functioning as an electronic component is built in the sensor body 7. When the actuator 6 approaches the sensor body 7, the RFID reader of the sensor body 7 reads ID data from the RFID of the actuator 6. If the ID data matches the previously stored ID, the output of the sensor body 7 is turned on. In this way, since the RFID type performs ID verification, it is possible to prevent malfunction even when another RFID or another type of RFID is read (invalidation prevention function). Further, it is possible to detect a failure of the sensor itself by executing software on the IC provided in the sensor body 7.

As described above, since the non-contact safety switch 100 has no sliding portion, no wear debris is generated due to sliding. Thus, the non-contact safety switch 100 can be suitably used as a switch for detecting the opening/closing of a safety door in a semiconductor manufacturing apparatus, a food or cosmetics manufacturing line, or the like. Further, since the electronic apparatus 1 has a structure in which the resin is filled in the case 10 as described above, the electronic apparatus is less susceptible to water and dust from the surroundings during cleaning. Thus, it is possible to provide the more reliable non-contact safety switch 100.

(Application Example to Photoelectric Sensor)

FIG. 8 is a diagram showing a configuration example when the electronic apparatus 1 is applied to a photoelectric sensor 200. The photoelectric sensor 200 is realized by a combination of the electronic apparatus 1 functioning as a light transmitting part 8 and the electronic apparatus 1 functioning as a light receiving part 9. Additionally, one electronic apparatus 1 may be a photoelectric sensor 200 functioning as both the light transmitting part 8 and the light receiving part 9.

When the light transmitted through the light transmitting part 8 is blocked or reflected by a detection object, the amount of the light reaching the light receiving part 9 changes. The light receiving part 9 detects this change, converts the change into an electric signal, and outputs the electric signal. The electronic apparatus 1 functioning as the light transmitting part 8 includes a light emitting element 80 functioning as an electronic component and the electronic apparatus 1 functioning as the light receiving part 9 includes a light receiving element 90 functioning as an electronic component. Additionally, the electronic apparatus 1 functioning as the light transmitting part 8 may further include a power supply part and the electronic apparatus 1 functioning as the light receiving part 9 may further include an amplification part, a control part, and a power supply part.

In this way, since the photoelectric sensor 200 can detect a detection object without mechanically touching the object, the detection object and the sensor itself are less likely to be scratched and worn. Thus, the photoelectric sensor can be suitably used to detect an object in a semiconductor manufacturing apparatus, a food or cosmetics manufacturing line, or the like similarly to the non-contact safety switch 100. Further, since the electronic apparatus 1 has a structure in which the resin is filled in the case 10 as described above, the electronic apparatus is less susceptible to water and dust from the surroundings during cleaning. Thus, it is possible to provide the more reliable photoelectric sensor 200.

§5. Modification

Figure 6A:
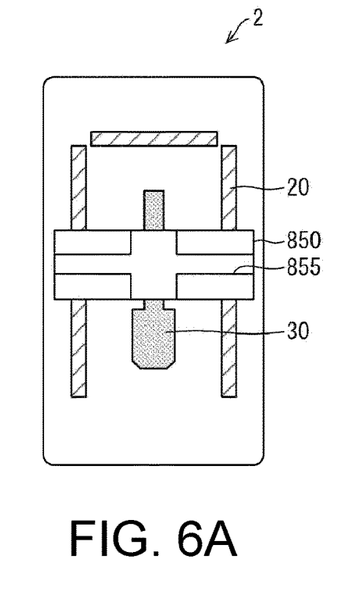
FIGS. 6A to 6C are diagrams each schematically showing a cross-section of an electronic apparatus according to a modification of this embodiment taken along the line A-A in FIG. 3.
Figure 6B:
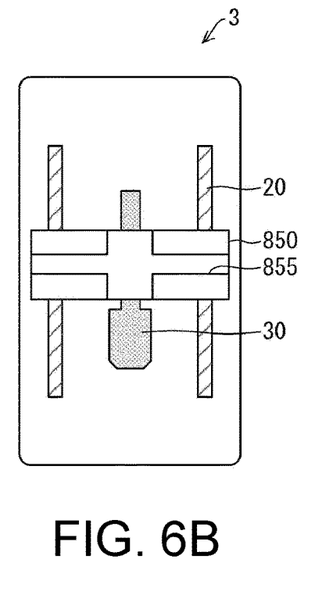
Figure 6C:
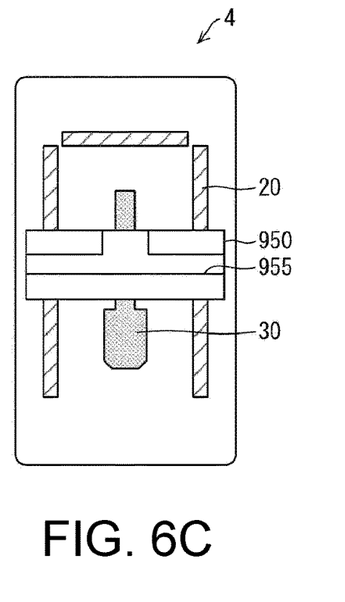

A modification of the above-described embodiment will be described with reference to FIGS. 3 and 6C. FIGS. 6A to 6C are diagrams each schematically showing a cross-section of an electronic apparatus according to the modification of this embodiment taken along the line A-A in FIG. 3. For convenience of description, the same reference numerals are given to the members having the same functions as the members described in the above-described embodiment, and the description thereof will not be repeated.

In this modification, the position of the filling port of the resin and the shape and position of the fluid branch member are different from those of the above-described embodiment. In this modification, the position of the filling port of the resin is G2 shown in FIG. 3. Further, in electronic apparatuses 2, 3, and 4 according to this modification, fluid branch members 850 and 950 have the opening 511 (not shown) on the surface with the filling port.

As shown in FIG. 6A, in this modification, the fluid branch member 850 of the electronic apparatus 2 includes two grooves 855 which are orthogonal to each other as the outflow part. The two grooves perpendicularly intersect each other at the center portion (located on the center extension line of the opening 511 when the resin flows in a direction indicated by the arrow G2 from the opening 511) of the fluid branch member 850. In the electronic apparatus 2, three substrates 20 are provided similarly to the above-described embodiment and two grooves of the groove 855 include a groove which is provided in parallel to two substrates 20 disposed in parallel and a groove which is provided perpendicularly.

In the grooves 855 of the electronic apparatus 2, the groove which is disposed in parallel to two substrates 20 is formed such that an end portion of the groove is located on the inside of the substrate 20 to guide the resin into the space surrounded by the substrate 20. On the other hand, in the grooves 855, the groove which is disposed perpendicularly to two substrates 20 is formed such that an end portion of the groove is located on the outside of two substrates 20 and the inside of the case to guide the flow of the resin to the space between the case and the substrate 20. Therefore, the resin flowing into the fluid branch member 850 from the filling port branches into four parts at the intersection of the two grooves in the groove 855. Two parts of the resin branching into four parts are filled into the space surrounded by the substrates 20 and the remaining two parts are filled into the space between the case and the substrate 20.

In this way, the electronic apparatus 2 according to this modification can independently fill the resin into the plurality of spaces through different paths. Therefore, the electronic apparatus 2 according to this modification has the same effect as the electronic apparatus 1 according to the above-described embodiment.

The electronic apparatus 3 according to this modification is different from the previous electronic apparatus 2 in that only two substrates 20 are disposed in parallel as shown in FIG. 6B. In the electronic apparatus 2, one of two end portions of the groove disposed in parallel to two substrates 20 is located in the space surrounded by three substrates 20, but the other end portion is located in the space between two substrates. Since the latter space communicates with the space between the case and the substrate 20, the space surrounded by three substrates 20 is smaller than the other space in an example. In that case, air cannot easily escape in the small space, so that the unfilled place of the resin may be generated. In the electronic apparatus 3 according to this modification, in order to suppress the generation of the unfilled place, the number of substrates 20 is set to two, and the difference in the size of the space at the tip of the two end portions of the groove is reduced. Accordingly, it is possible to more reliably suppress the generation of the unfilled place of the resin.

As shown in FIG. 6C, the electronic apparatus 4 according to this modification is provided with three substrates 20 similarly to the electronic apparatus 2. The fluid branch member 950 of the electronic apparatus 4 is different from that of the electronic apparatus 2 in that a groove 955 having a T shape when viewed from the filling port is provided as the outflow part to be parallel to each of the orthogonal surfaces of the case. The groove 955 includes three grooves composed of two grooves which are provided in a straight line from the center portion of the fluid branch member 950 toward the surface of the case and one groove which extends perpendicularly to the two grooves from one wall of the two grooves from the center portion. In the groove 955, the end portions of two grooves are disposed on the outside of two substrates 20 disposed in parallel and the inside of the case to guide the resin to the space between the case and each substrate 20.

The resin flowing from the filling port into the fluid branch member 950 branches into three parts and flows to each of four surfaces of the case. Here, in the groove 855 of the electronic apparatuses 2 and 3, the groove provided in parallel to two substrates 20 disposed in parallel is formed such that the end portion of the groove is located on the inside of the substrate 20 to guide the resin to the space surrounded by the substrate 20. Further, in the groove 855, the groove provided to be orthogonal to two substrates 20 disposed in parallel is formed such that the end portion is located on the outside of two substrates 20 disposed in parallel and the inside of the case to guide the resin to the space between the case and each substrate 20.

In this way, also in the electronic apparatus 4 according to this modification, it is possible to independently fill the resin into the plurality of spaces through different paths. Therefore, the electronic apparatus 4 according to this modification has the same effect as the electronic apparatus 1 according to the above-described embodiment and also has the effect described in the electronic apparatus 3.

[Summary]

The disclosure employs the following configuration in order to solve the above-described problems.

That is, an electronic apparatus according to an aspect of the disclosure (hereinafter, referred to as "this embodiment") includes: a case; one or more substrates disposed in the case, on which an electronic component is mounted; a thermoplastic hot-melt resin filled in the case; and a fluid branch member, wherein the inside of the case is divided into a plurality of spaces, wherein the plurality of spaces are at least any space among spaces between the case and the substrate and spaces between the substrates and are filled with the thermoplastic hot-melt resin, and wherein the fluid branch member is provided with an opening as an inlet for filling the thermoplastic hot-melt resin into the case and a flow path part for branching the thermoplastic hot-melt resin into multiple parts and guiding the thermoplastic hot-melt resin from the opening to the plurality of spaces. Additionally, the "resin" includes not only resin compounds but also mixtures containing fillers such as silica, stabilizers such as antioxidants, and additives such as plasticizers.

In a manufacturing process of the electronic apparatus according to an aspect of the disclosure, the thermoplastic hot-melt resin flows into the case. When the thermoplastic hot-melt resin flows from the opening of the fluid branch member into the case, the resin flows through the flow path part of the fluid branch member. The fluid branch member is provided with a branch to guide the flow of the thermoplastic hot-melt resin to the plurality of spaces. The branched thermoplastic hot-melt resin advances in the flow path part and flows into the plurality of spaces. The flowing thermoplastic hot-melt resin fills each space and efficiently pushes the air in the space to the outside through the air vent arbitrarily provided in the case. Finally, the thermoplastic hot-melt resins flowing into the respective spaces merge with each other at the air vent as the final flow end part and the filling into the case is completed. In this way, the resin can be filled in the plurality of spaces and the residual air bubbles therein can be minimized. That is, it is possible to suppress the generation of the unfilled place of the resin in the space of the case.

In the electronic apparatus according to this embodiment, it is possible to branch the thermoplastic hot-melt resin prior to the filling of the resin into the plurality of spaces. Therefore, it is possible to reduce the probability that only one of the spaces is preferentially filled even when the sizes of the plurality of spaces are different. In this way, the electronic apparatus according to this embodiment can suppress the generation of the unfilled place of the resin in the space of the case by controlling the flow of the thermoplastic hot-melt resin. Thus, according to the above-described configuration, since it is possible to cover the substrate built in the case with the resin, it is possible to provide the electronic apparatus having excellent voltage resistance and water resistance.

The electronic apparatus according to the above-described embodiment may further include: a substrate holding part for fixing the substrate to a predetermined position in the case and the fluid branch member may be fixed to the substrate holding part. According to this configuration, it is possible to more stably control the flow of the resin. Accordingly, it is possible to further suppress the generation of the unfilled place of the resin in the space of the case and to more reliably cover the substrate with the resin.

In the electronic apparatus according to the above-described embodiment, the substrate may include at least a first substrate and a second substrate, the spaces may include a first space between the first substrate and the case, a second space between the second substrate and the case, and a third space between the first substrate and the second substrate, and the fluid branch member may include a first flow path part for guiding the resin from the opening to the first space, a second flow path part for guiding the resin from the opening to the second space, and a third flow path part for guiding the resin from the opening to the third space. According to this configuration, it is possible to control the flow of the resin from each of the first flow path part, the second flow path part, and the third flow path part to each of the first space, the second space, and the third space. Since the substrate faces any of the first space, the second space, and the third space, it is possible to more reliably cover the substrate with the resin by suppressing the generation of the unfilled place of the resin in such a space.

In the electronic apparatus according to the above-described embodiment, a cross-sectional area of the flow path part of the fluid branch member may be 0.2 mm$^2$ or more. According to this configuration, since the fluidity of the resin is satisfactory, it is possible to further suppress the generation of the unfilled place of the resin in the space of the case and to more reliably cover the substrate with the resin.

In the electronic apparatus according to the above-described embodiment, the thermoplastic hot-melt resin may be any one of a polyamide hot-melt resin, a polyester hot-melt resin, and a polyolefin hot-melt resin or a combination thereof. According to this configuration, since the electronic apparatus can be filled with the resin at low temperature and low pressure, it is possible to reduce heat damage and stress damage to the built-in electronic components, resin components such as cases, cables, and the like. Here, the "polyamide-based resin" is a resin containing a constituent unit derived from polyamide as a main constituent element and includes a homopolymer of polyamide and both a monomer copolymerizable with polyamide and a copolymer of polyamide. The same applies to other resins listed as "based resins".

Further, a non-contact switch according to this embodiment includes two electronic apparatuses, the first electronic apparatus includes an actuator as the electronic component, the second electronic apparatus includes a sensor as the electronic component, and when a distance between the actuator and the sensor becomes a predetermined value or less, the output of the sensor is turned on.

Further, a photoelectric sensor according to this embodiment is a photoelectric sensor configured by the electronic apparatus and includes at least one of a light transmitting part and a light receiving part as the electronic component.

It goes without saying that the disclosure is not limited to the following examples and various aspects are possible for details. Further, the disclosure is not limited to the above embodiments and modifications and can be modified into various forms within the scope of the claims. That is, an embodiment obtained by combining technical means appropriately modified within the scope of the claims is also included in the technical scope of the disclosure.

§6. Examples

Examples are shown below and embodiments of the disclosure will be described in more detail. Of course, the disclosure is not limited to the following examples, and it goes without saying that various aspects are possible for details.

[Examples]

The electronic apparatuses described with reference to FIGS. 1 to 5 in the above-described embodiments were manufactured, and the filled state, water resistance, and voltage resistance of the resin in the case were evaluated. Additionally, the resin was filled from G1 in the drawing.

(Manufacture of Electronic Apparatus)

Toyobo's Vyloshot (polyester) was used as the resin, and Canon Electronics' LS-300i was used as the molding machine. The molding machine was set to have a cylinder temperature of 240° C., an injection speed of 20 mm/sec, and an injection pressure of 4.0 MPa.

(Evaluation)

As an evaluation of the filled state, an X-ray inspection device was used to confirm the presence or absence of unfilled places in the space between the case and the substrate and the space between the substrates. Further, when there was an unfilled place in the space between the substrates, it was confirmed whether or not the unfilled place communicated with the outside of the case.

As an evaluation of water resistance, an IP67 standard test and an IP69K standard test were conducted to confirm whether or not the criteria was satisfied.

As an evaluation of voltage resistance, it was confirmed whether or not the standards IEC60947-5-2 and IEC60947-5-2 were satisfied.

(Result)

Filled state: No unfilled place of the resin was found in the space between the case and the substrate. The unfilled place was found in the space between the substrates, but all of them were slight bubbles and did not communicate with the outside of the case.

Water resistance: The insulation resistance value after the test exceeded 2.55 GΩ, which satisfied the criteria in both standards.

Voltage resistance: The leakage current under AC 1000 V was 1 mA or less, which satisfied all criterion.

[Comparative Example]

The operation was performed in the same manner as in the example except that the electronic apparatus was not provided with the fluid branch member. The result was as follows.

Filled state: The unfilled place was found in the space between the case and the substrate and the space between the substrates.

Water resistance: The insulation resistance value after the test was less than 20 MΩ, which did not satisfy the criteria of either standard.

Voltage resistance: The leakage current under AC 750V was 1 mA or more, which did not satisfy all criterion.

What is claimed is:

1. An electronic apparatus comprising:
    a case;
    a plurality of substrates disposed in the case, each of the plurality of substrates being mounted with an electronic component thereon;
    a thermoplastic hot-melt resin filled in the case;
    a fluid branch member; and
    a substrate holding part for fixing the plurality of substrates to predetermined positions in the case,
    wherein the fluid branch member is fixed to the substrate holding part,
    wherein the inside of the case is divided by the plurality of substrates into a plurality of spaces,
    wherein the plurality of spaces comprises spaces between the case and one or more of the plurality of substrates and spaces between the plurality of substrates, and are filled with the thermoplastic hot-melt resin, and
    wherein the plurality of substrates comprises at least two substrates that are disposed parallel to each other along a first direction,
    the substrate holding part is located in a space between the two substrates, and
    the fluid branch member is fixed below the holding part and the two substrates in the first direction,
    wherein the fluid branch member is provided with:
    an opening as an inlet for filling the thermoplastic hot-melt resin into the case, and
    a flow path part for branching the thermoplastic hot-melt resin into multiple parts and guiding the thermoplastic hot-melt resin from the opening to the plurality of spaces.

2. The electronic apparatus according to claim 1,
    wherein the plurality of substrates comprises a first substrate disposed in a second direction perpendicular to the first direction, and two second substrates being the two substrates disposed in parallel to each other along the first direction,
    wherein the plurality of spaces comprise a first space between the first substrate and the case, a second space between the two second substrates and the case, and a third space surrounded by the first substrate and the two second substrates, the third space being the space in which the substrate holding part is located, and
    wherein the fluid branch member comprises a first flow path part for guiding the thermoplastic hot-melt resin from the opening to the first space, a second flow path part for guiding the thermoplastic hot-melt resin from the opening to the second space, and a third flow path part for guiding the thermoplastic hot-melt resin from the opening to the third space.

3. The electronic apparatus according to claim 1,
    wherein a cross-sectional area of the flow path part of the fluid branch member is 0.2 mm$^2$ or more.

4. The electronic apparatus according to claim 1,
    wherein the thermoplastic hot-melt resin is any one of a polyamide hot-melt resin, a polyester hot-melt resin, and a polyolefin hot-melt resin or a combination thereof.

5. A non-contact switch comprising:
    two electronic apparatuses according to claim 1,
    wherein one of the two electronic apparatuses comprises an actuator as the electronic component,
    wherein the other one of the two electronic apparatuses comprises a sensor as the electronic component, and
    wherein when a distance between the actuator and the sensor becomes a predetermined value or less, the output of the sensor is turned on.

6. A photoelectric sensor configured by the electronic apparatus according to claim 1, comprising:
    at least one of a light transmitting part and a light receiving part as the electronic component.

* * * * *